US006969576B2

United States Patent
Dentinger et al.

(10) Patent No.: US 6,969,576 B2
(45) Date of Patent: Nov. 29, 2005

(54) PHOTOSENSITIVE DISSOLUTION INHIBITORS AND RESISTS BASED ON ONIUM SALT CARBOXYLATES

(75) Inventors: Paul M. Dentinger, Sunol, CA (US); Kelby L. Simison, Hattiesburg, MS (US)

(73) Assignee: Sandia National Laboratories, Livermore, CA (US)

( * ) Notice: Subject to any disclaimer, the term of this patent is extended or adjusted under 35 U.S.C. 154(b) by 383 days.

(21) Appl. No.: 10/000,429

(22) Filed: Nov. 30, 2001

(65) Prior Publication Data
US 2003/0104310 A1 Jun. 5, 2003

(51) Int. Cl.$^7$ .............................................. G03F 7/004
(52) U.S. Cl. ................................. 430/270.1; 430/914
(58) Field of Search ............................ 433/270.1, 914

(56) References Cited

U.S. PATENT DOCUMENTS

| | | | | |
|---|---|---|---|---|
| 5,310,581 A | * | 5/1994 | Schmidt et al. ............. 427/558 |
| 5,310,619 A | | 5/1994 | Crivello et al. ........... 430/270.1 |
| 5,332,648 A | * | 7/1994 | Kihara et al. ............. 430/270.1 |
| 5,362,607 A | * | 11/1994 | Crivello et al. ............. 430/326 |
| 5,405,991 A | * | 4/1995 | Feist et al. .................... 560/239 |
| 5,426,222 A | * | 6/1995 | Wargo et al. ................ 562/602 |
| 5,532,411 A | * | 7/1996 | Braun et al. ................. 562/861 |
| 5,908,721 A | * | 6/1999 | Emoto et al. ..................... 430/7 |
| 2002/0146639 A1 | * | 10/2002 | Brock et al. ............. 430/270.1 |
| 2003/0008246 A1 | * | 1/2003 | Cheng et al. ................ 430/323 |

* cited by examiner

Primary Examiner—Amanda Walke
(74) Attorney, Agent, or Firm—Donald A. Nissen

(57) ABSTRACT

A photoresist composition that employs onium salt carboxylates as thermally stable dissolution inhibitors. The photoresist composition can be either an onium carboxylate salt with a phenolic photoresist, such as novolac, or an onium cation protected carboxylate-containing resin such as an acrylic/acrylic acid copolymer. The onium carboxylate can be an onium cholate, wherein the onium cholate is an iodonium cholate. Particularly preferred iodonium cholates are alkyloxyphenylphenyl iodonium cholates and most particularly preferred is octyloxyphenyphenyl iodonium cholate. The photoresist composition will not create nitrogen or other gaseous byproducts upon exposure to radiation, does not require water for photoactivation, has acceptable UV radiation transmission characteristics, and is thermally stable at temperatures required for solvent removal.

13 Claims, 3 Drawing Sheets 10 micron line/space : OPPI+CA-/novolac 10 micron line/space : OPPI+CA-/novolac 17.5 micron line/space : OPPI+CA-/novolac 10 micron line/space : OPPI+CA-/novolac 6 micron line/space : OPPI+CA-/novolac

PHOTOSENSITIVE DISSOLUTION INHIBITORS AND RESISTS BASED ON ONIUM SALT CARBOXYLATES

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

The invention is directed to a novel photoresist composition that employs onium salt carboxylates. The photoresist composition combines either an onium carboxylate salt with a phenolic photoresist, such as novolac, or an onium cation protected carboxylate containing resin such as an acrylic/acrylic acid copolymer. The onium carboxylates provide a thermally stable dissolution inhibitor that, when exposed to light, promotes the dissolution of the photoresist, does not require water for the reaction, create nitrogen, and has acceptable radiation transmission characteristics.

There are a variety of applications for which thick film lithography can prove to be advantageous. For example, thick film lithography can be used to create plating molds to fashion small, high aspect ratio metal parts for micromechanical applications (e.g., LIGA), allow the semiconductor industry to extend the thickness of their bump technology, and provide for extension of thin film head manufacturers to extend their thickness regime. However, the photoresist compositions found to be generally useful for resist films thicker than 70 $\mu$m, such as SU-8 (MicroChem Corp., Marlboro, Mass.), have disadvantageous features; namely, solvent development and the highly crosslinked epoxy can be difficult to strip from a substrate. Consequently, there are good reasons to try to extend lithography as practiced by the semiconductor industry, i.e., thin film lithography, into the thick film regime.

Thin film lithography photoresists, such as positive working photoresists based on aqueous base soluble phenolic resins, have gained popularity because of their superior resolution potential, one micron with state-of-the art processes, and better etch resistance. Diazonapthoquinone/novolac (DNQ/novolac) is a positive working, multicomponent resist system consisting of a novolac resin prepared by the acid catalyzed co-polymerization of cresol and formaldehyde and a sensitizer, DNQ, which is base insoluble. Upon photolysis, DNQ produces a carbene which undergoes rearrangement to form a ketene. The ketene adds water, present in the resist film to form a base soluble indene carboxylic acid photo-product. DNQ/novolac resist systems are common in microcircuit manufacturing applications and consequently, there have been some attempts to extend the thickness and resolution capabilities of these materials to the thick film regime, film thicknesses of 75 $\mu$m or greater.

However, photoresists developed for thin film applications are not necessarily applicable to thicker film applications. For example, the DNQ/novolac resists discussed above suffer from several drawbacks. While DNQ/novolac photoresists are widely used, they are limited to film thickness below about 70 $\mu$m and the near UV (wavelengths greater than about 366 nm) because of the absorption characteristics of DNQ. Furthermore, DNQ/novolac resists form nitrogen gas upon exposure to radiation which causes bubbles in the resist film, and are generally not thermally stable enough to remove effectively the solvent from the thick films (generally greater than 75 $\mu$m) required for LIGA-type applications.

One approach to solving the problems associated with the use of thin film resist compositions for thick film applications is to replace DNQ in DNQ/novolac resists with a thermally stable dissolution inhibitor that when exposed to radiation promotes the dissolution of novolac but, at the same time, does not require water for the reaction. Moreover, it is desirable that the dissolution inhibitor chosen not create nitrogen or any other gaseous reactions products. The availability of such a dissolution inhibitor would allow the extension of novolac-based photoresists to thick film photoresist applications.

SUMMARY OF THE INVENTION

Accordingly, the present invention provides a photoresist composition that will not create nitrogen or other gaseous byproducts upon exposure to radiation, does not require water for reaction, and is thermally stable at temperatures required to remove a casting solvent.

The photoresist composition combines an onium carboxylate, wherein the carboxylate can be a cholate or a lithocholate and, in particular, the octyloxyphenylphenyl iodonium cholate, with novolac. In a second aspect of the invention, the onium salt of an acrylic/acrylic acid polymer is used to form a photoresist that possess the properties set forth above.

DETAILED DESCRIPTION OF THE INVENTION

Figure 1A:
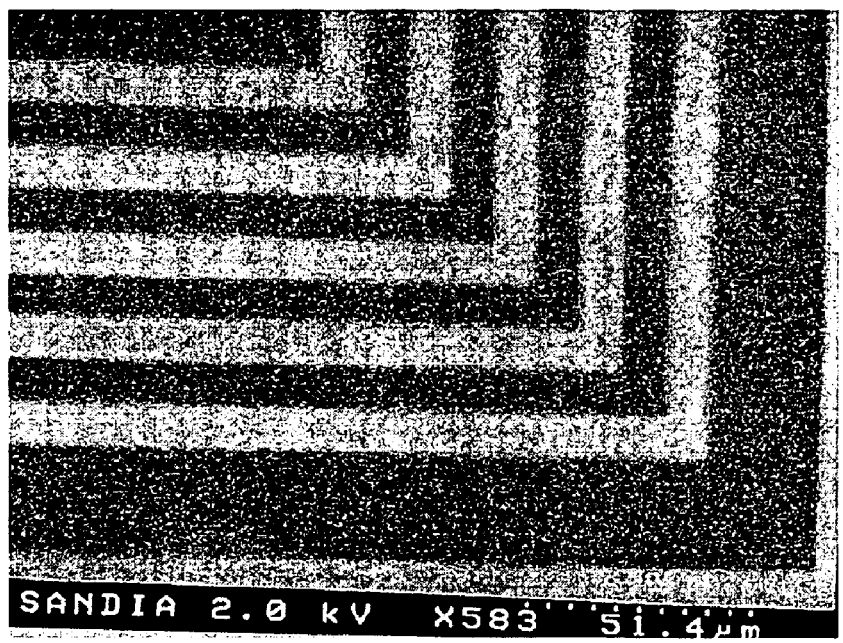
FIGS. 1A–1D show SEM photomicrographs of lines and spaces formed by a 20% octyloxyphenylphenyl iodonium cholate in novolac.
Figure 1B:
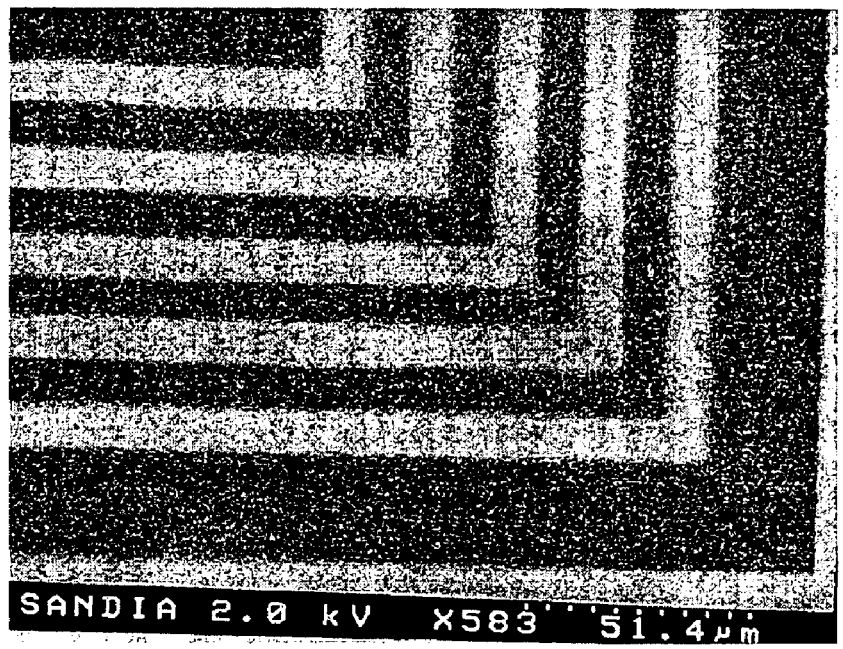
Figure 1C:
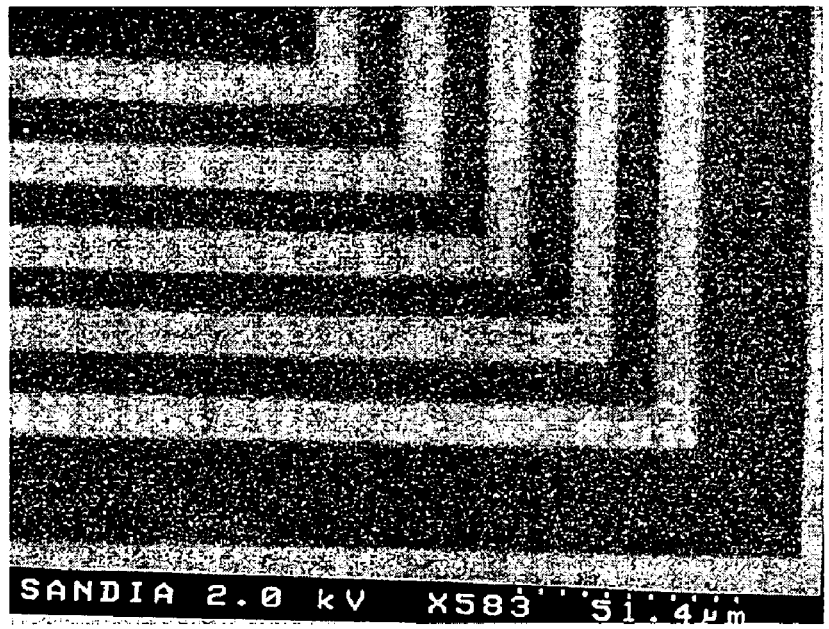
Figure 1D:
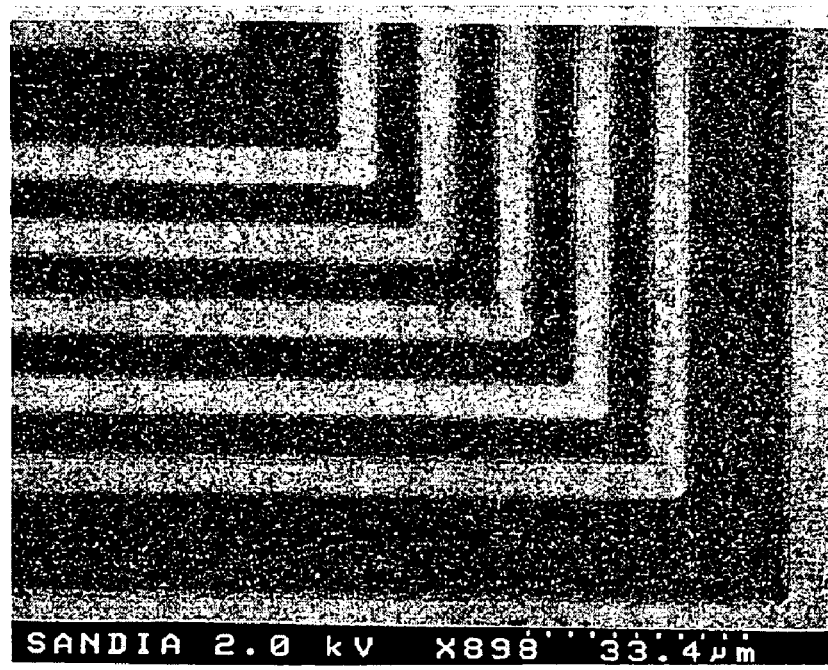

The present invention is directed to a positive tone photoresist provided by addition of an onium hydroxide to a carboxylic acid containing polymer as well as the combination of an onium carboxylate, that can be produced by reacting together and onium hydroxide and cholic acid, and a phenolic resin polymer such as novolac. The onium salt/carboxylic acid combination provides a thermally stable, photolabile dissolution inhibitor that when exposed to radiation promotes the dissolution of a polymer, does not require water for reaction, and has high enough UV transmission to allow films greater than 100 $\mu$m thick to be formed.

Onium compounds or onium salts refer to a family of iodonium, bromoniunm, chloronium or sulfonium compounds, typified by triarylsulfonium, diarylchloronium, diarylbromonium, diphenyliodoniumhexafluoroarsenate, and octyloxyphenylphenyl iodonium halide. Further examples are known to those skilled in the art. These compounds or salts are typified by the characteristic that upon photon absorption they undergo photolysis to generate a strong acid. The acid thus liberated catalyzes acidolysis or depolymerization. The hydroxy groups formed by the catalyzed acidolysis make the decomposed polymer soluble in alkaline solution, thereby differentiating it from unexposed and thus unreacted resist material. Since each acid produces a chain of events, the overall quantum efficiency is greatly amplified. Onium carboxylate salts can act as dissolution inhibitors. Preferred onium carboxylate salts are the onium cholate, onium lithocholate, onium deoxycholate, or onium salts of congeners of cholic acid. Of the onium cholates a preferred compound is the iodonium cholate. The alkyloxyphenylphenyl iodonium cholate is particularly preferred and the octyloxyphenylphenyl iodonium cholate is most particularly preferred.

It should be noted that throughout the written description of the invention that for the sake of simplicity and convenience the octyloxyphenylphenyl iodonium cation will be designated by the abbreviation "OPPI". Further, the term radiation refers to electromagnetic radiation of any wavelength.

The scheme generally employed here is to combine an onium salt with a carboxylic acid functionality to form a thermally stable dissolution inhibitor.

The octyloxyphenylphenyl iodonium (OPPI) hydroxide can be made by reacting $Ag_2O$ with an OPPI halide. The OPPI hydroxide can then be added to acrylic/acrylic acid copolymer to form a single compound resist. In a second aspect of the invention, an onium hydroxide can be combined with a carboxylic acid and, in particular with cholic acid or a cholic acid congener, such as lithocholic acid or deoxycholic acid, to form a cholate that can be formulated with a novolac-based resist. It should be noted that throughout the written description of the invention the term "cholate" refers to the salts of cholic acid and its congeners such as lithocholic acid.

The invention is illustrated by the following examples.

EXAMPLE 1

OPPI cholate was prepared by reacting a solution of an OPPI halide, preferably the OPPI chloride, with $Ag_2O$ to form the hydroxide, filtering the solution, and subsequently reacting the OPPI hydroxide with a cholic acid solution to prepare the OPPI cholate. About 20 wt % of the OPPI cholate reaction product was mixed with novolac [HRJ 10805 (Schenectady)] in a common solvent such as propylene glycol monomethylether acetate (PGMA). A film of the novolac/OPPI cholate solution was spun onto a silicon wafer and baked at a temperature of about 125° C. to remove the solvent. The film was exposed to broad band (330–500 nm) UV radiation using a proximity aligner and developed with LDD-26W (Shipley Co., Marlboro, Mass.) aqueous base developer for 195 seconds. The film can be easily stripped in acetone. Scanning electron micrographs (SEM) of the resulting images are shown in FIGS. 1A–1D.

The dissolution rate of the unexposed OPPI cholate/novolac resist in aqueous base was about $1.3 \times 10^{-4}$ μm/sec, as determined by the loss in thickness of the unexposed film during the development cycle. In comparison, the dissolution rate of a pure novolac film was about $1.3 \times 10^{-2}$ μm/sec. The dissolution rate of a novolac film having about 30 wt % cholic acid added was about 0.5–1 μm/sec. From these data, it is evident that the OPPI cholate/novolac combination is a positive tone resist. As has been discussed above, the OPPI cholate will not create nitrogen or other gaseous products and does not require water for reaction. The OPPI cholate was shown to be stable up to temperatures of at least 125° C.

EXAMPLE 2

In another aspect of the invention, OPPI hydroxide was admixed with methyl methacrylate/methacrylic acid copolymer in a ratio of about 72.5 mole % copolymer:27.5 mole % OPPI hydroxide to react the OPPI hydroxide with the free carboxylic acids. A film of the resist was spun onto a silicon wafer and exposed to an open frame broadband radiation source and developed as above. The polymer/onium salt carboxylate product was shown to be a positive tone resist with aqueous base development.

EXAMPLE 3

Figure 2:
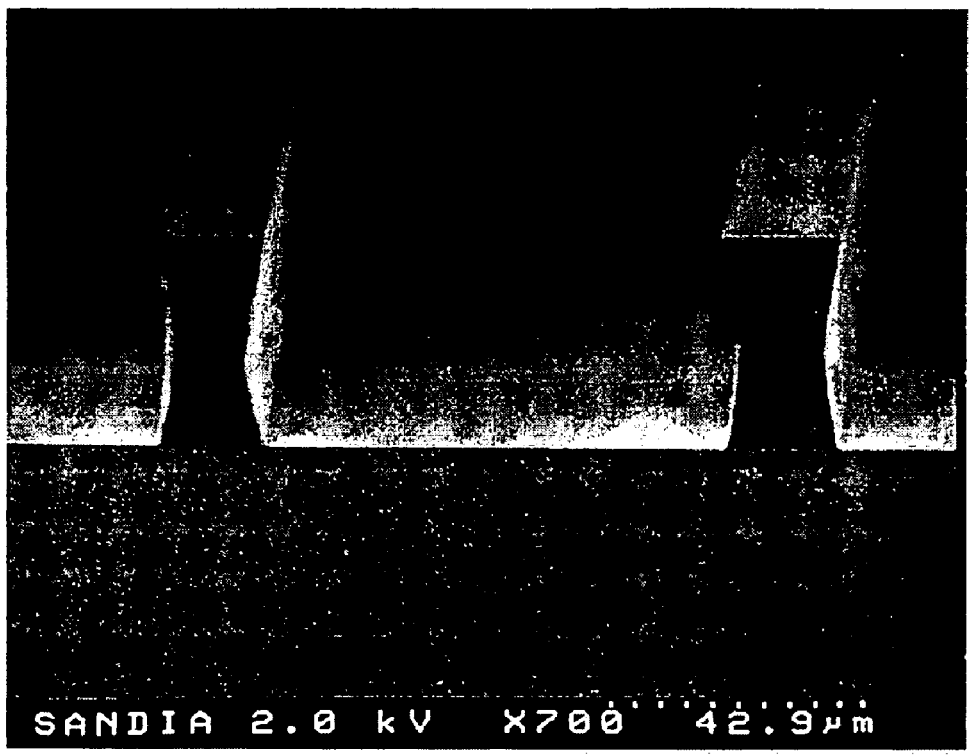
FIG. 2 is a SEM micrograph of the cross-section of a 35 $\mu$m thick film of novolac/OPPI carboxylate resist.

A commercial phenolic-based photoresist composition, PD-193A (Borden Chemical) was mixed with 25 wt % OPPI cholate and spin-coated onto a Si substrate to form a film about 35 μm thick. The film was exposed with a broad band proximity aligner. FIG. 2 shows the lines and spaces of a 35 μm novolac/OPPI cholate resist film.

The foregoing is intended to be illustrative of the present invention and is provided for purposes of clarity and understanding of the principles of this invention. Many other embodiments and modifications can be made by those of skill in the art without departing from the spirit and scope of the invention as defined in the following claims.

We claim:

1. A photoresist composition, comprising an admixture of a phenolic resin and one of an onium cholate, onium lithocholate, or onium deoxycholate salt, wherein the dissolution rate of said photoresist composition in aqueous base is less than about $1.3 \times 10^{-4}$ μm/sec.

2. The photoresist composition of claim 1, wherein the onium cholate is an iodonium cholate.

3. The photoresist composition of claim 2, wherein the iodonium cholate is an alkyloxyphenylphenyl iodonium cholate.

4. The photoresist composition of claim 3, wherein the alkyloxyphenylphenyl iodonium cholate is octyloxyphenylphenyl iodonium cholate.

5. The photoresist composition of claim 1, wherein the phenolic resin is novolac.

6. The photoresist composition of claim 1, wherein the onium carboxylate is present in an amount of at least 20 wt %.

7. The photoresist composition of claim 1, wherein said photoresist composition can withstand pre-exposure baking temperatures of at least 125° C.

8. A photoresist composition, comprising an iodonium cation protected carboxylate polymer.

9. The photoresist composition of claim 8, wherein the polymer is an acrylic/acrylic acid copolymer.

10. The photoresist composition of claim 9, wherein the copolymer is a methacrylic/acrylic acid copolymer.

11. The photoresist composition of claim 8, wherein the iodonium cation is an alkyloxyphenylphenyl iodonium cation.

12. The photoresist composition of claim 11, wherein the alkyloxyphenylphenyl cation is an octyloxyphenylphenyl iodonium cation.

13. The photoresist composition of claim 8, wherein the onium cation is present at a concentration of at least 25 mole %.

* * * * *